United States Patent
Chae et al.

(10) Patent No.: US 12,287,376 B2
(45) Date of Patent: Apr. 29, 2025

(54) BATTERY SYSTEM DIAGNOSING APPARATUS AND METHOD

(71) Applicant: LG ENERGY SOLUTION, LTD., Seoul (KR)

(72) Inventors: Su-Hyun Chae, Daejeon (KR); Bom-Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 243 days.

(21) Appl. No.: 17/791,595

(22) PCT Filed: Jan. 4, 2022

(86) PCT No.: PCT/KR2022/000094
§ 371 (c)(1),
(2) Date: Jul. 8, 2022

(87) PCT Pub. No.: WO2022/154354
PCT Pub. Date: Jul. 21, 2022

(65) Prior Publication Data
US 2023/0236259 A1    Jul. 27, 2023

(30) Foreign Application Priority Data

Jan. 13, 2021 (KR) .................. 10-2021-0004822

(51) Int. Cl.
*G01R 31/392* (2019.01)
*G01R 31/36* (2020.01)
(Continued)

(52) U.S. Cl.
CPC ....... *G01R 31/392* (2019.01); *G01R 31/3648* (2013.01); *G01R 31/367* (2019.01); *G01R 31/396* (2019.01); *H01M 10/4285* (2013.01)

(58) Field of Classification Search
CPC ............ H01M 10/4285; H01M 10/48; H01M 16/006; G01R 31/386; G01R 31/396; B60W 50/0205; B60W 2510/242
(Continued)

(56) References Cited

U.S. PATENT DOCUMENTS

| | | | |
|---|---|---|---|
| 8,717,035 B2 * | 5/2014 | Shook | G01R 31/396 320/162 |
| 8,970,178 B2 * | 3/2015 | Berkowitz | H01M 10/44 320/141 |

(Continued)

FOREIGN PATENT DOCUMENTS

| | | |
|---|---|---|
| CN | 106443489 A | 2/2017 |
| CN | 111164437 A | 5/2020 |

(Continued)

OTHER PUBLICATIONS

Extended European Search Report for European Application No. 22739552.2, dated Sep. 8, 2023.

*Primary Examiner* — Raul J Rios Russo
*Assistant Examiner* — Trung Q Nguyen
(74) *Attorney, Agent, or Firm* — Birch, Stewart, Kolasch & Birch, LLP (57) ABSTRACT

A battery diagnosing technology capable of effectively diagnosing a defective battery cell among a plurality of battery cells included in a battery system at an early stage. The battery system diagnosing apparatus diagnoses a battery system including a plurality of battery cells having electrode tabs therein, and includes a cell measuring unit for measuring a voltage or current for each of the plurality of battery cells; and a processor for calculating a state of health (SOH) for each battery cell multiple times over time by using the voltage or current measured by the cell measuring unit and detecting a battery cell having a defect in the electrode tab (Continued)

among the plurality of battery cells based on the SOH of each battery cell calculated multiple times.

20 Claims, 5 Drawing Sheets (51) Int. Cl.
*G01R 31/367* (2019.01)
*G01R 31/396* (2019.01)
*H01M 10/42* (2006.01)

(58) Field of Classification Search
USPC .............. 324/500, 600, 76.11, 551, 425–434
See application file for complete search history.

(56) References Cited

U.S. PATENT DOCUMENTS

| | | | |
|---|---|---|---|
| 10,556,510 B2* | 2/2020 | Yazami | ............... H01M 10/486 |
| 2009/0051324 A1 | 2/2009 | Nakatsuji | |
| 2011/0301891 A1 | 12/2011 | Kim | |
| 2015/0153417 A1 | 6/2015 | Maluf et al. | |
| 2016/0146895 A1 | 5/2016 | Yazami | |
| 2020/0274386 A1 | 8/2020 | Kirleis et al. | |
| 2020/0381929 A1 | 12/2020 | Jin | |
| 2022/0242272 A1* | 8/2022 | Okamoto | ................ B60L 58/21 |
| 2022/0334189 A1* | 10/2022 | Min | ..................... G01R 31/388 |

FOREIGN PATENT DOCUMENTS

| | | |
|---|---|---|
| EP | 2 339 716 A1 | 6/2011 |
| EP | 2 365 602 A2 | 9/2011 |
| EP | 3 982 140 A1 | 4/2022 |
| JP | 2007-240234 A | 9/2007 |
| JP | 2011-112453 A | 6/2011 |
| JP | 2017-125680 A | 7/2017 |
| KR | 10-2009-0010052 A | 1/2009 |
| KR | 10-2010-0016854 A | 2/2010 |
| KR | 10-2011-0134019 A | 12/2011 |
| KR | 10-1853382 B1 | 4/2018 |
| KR | 10-2019-0043457 A | 4/2019 |
| KR | 10-1979536 B1 | 5/2019 |
| KR | 10-2019-0094714 A | 8/2019 |
| KR | 10-2020-0054031 A | 5/2020 |
| KR | 10-2146945 B1 | 8/2020 |
| KR | 10-2021-0014003 A | 2/2021 |

* cited by examiner

BATTERY SYSTEM DIAGNOSING APPARATUS AND METHOD

TECHNICAL FIELD

The present application claims priority to Korean Patent Application No. 10-2021-0004822 filed on Jan. 13, 2021 in the Republic of Korea, the disclosures of which are incorporated herein by reference.

The present disclosure relates to a battery diagnosing technology, and more particularly, to a battery diagnosing technology capable of diagnosing a defective battery cell in a state of a battery system including a plurality of battery cells.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

The lithium secondary battery mainly uses lithium-based oxide and carbon material as positive electrode active material and negative electrode active material, respectively. Also, the lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

Generally, according to the shape of the exterior, lithium secondary batteries may be classified into a can-type secondary battery in which the electrode assembly is built into a metal can and a pouch-type secondary battery in which the electrode assembly is built in a pouch of an aluminum laminate sheet. In particular, the pouch-type secondary battery tends to be more widely used due to its advantages such as easy stacking and light weight.

The pouch-type secondary battery may be manufactured by injecting an electrolyte in a state where an electrode assembly is accommodated in a pouch exterior and then sealing the pouch exterior.

Figure 1:
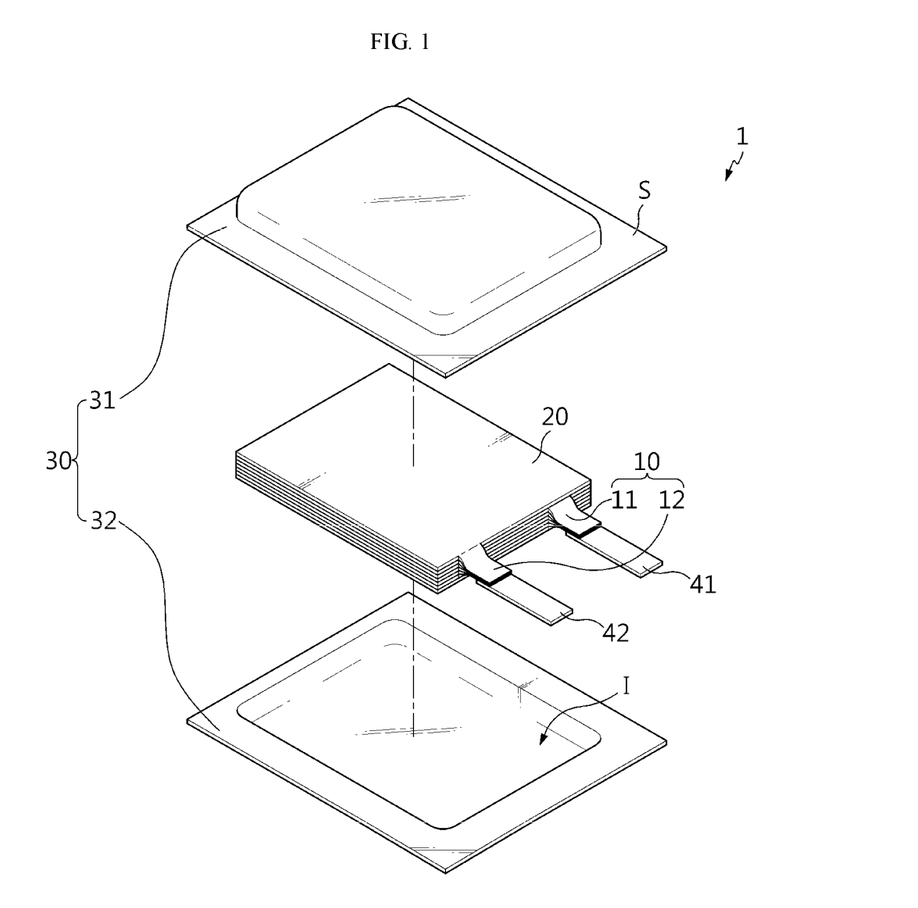
FIG. 1 is an exploded perspective view showing a general pouch-type secondary battery.
Figure 2:
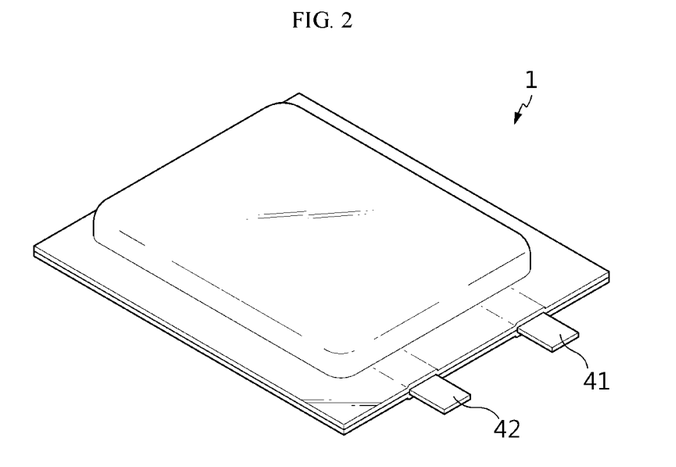
FIG. 2 is a perspective view showing the pouch-type secondary battery of FIG. 1.

FIG. 1 is an exploded perspective view showing a general pouch-type secondary battery, and FIG. 2 is a perspective view showing the pouch-type secondary battery of FIG. 1.

As shown in FIGS. 1 and 2, the pouch-type secondary battery 1 may include an electrode assembly 20 and a pouch exterior 30 for accommodating the electrode assembly 20.

Here, the electrode assembly 20 has a basic structure including a positive electrode plate, a negative electrode plate, and a separator interposed therebetween, and may be accommodated in an inner space I formed inside the pouch exterior 30. At this time, the pouch exterior 30 may be formed with an upper pouch 31 and a lower pouch 32, and sealing portions S are provided on outer peripheral surfaces of the upper pouch 31 and the lower pouch 32, so that the sealing portions S are adhered to each other to seal the inner space I in which the electrode assembly 20 is accommodated.

Here, at least one positive electrode tab 11 and at least one negative electrode tab 12 may extend from the positive electrode plate and the negative electrode plate, respectively.

In addition, the positive electrode tab 11 and the negative electrode tab 12 may be coupled with plate-shaped electrode leads, namely a plate-shaped positive electrode lead 41 and a plate-shaped negative electrode lead 42, respectively. In addition, a portion of the positive electrode lead 41 and a portion of the negative electrode lead 42 may be exposed out of the pouch exterior 30 to provide an electrode terminal that is electrically connected to an external configuration of the secondary battery, for example another secondary battery or an external device.

As the field of application of secondary batteries has expanded, in recent years, secondary batteries are becoming widely used for driving or energy storage, not only in small devices such as portable electronic devices, but also in medium and large devices such as vehicles and energy storage systems (ESS). In the case of such a medium-large device, in order to increase output or capacity, a large number of secondary batteries may be electrically connected in series and/or in parallel. In particular, in the case of an energy storage system, a very large number of secondary batteries may be included. For example, the energy storage system may include a plurality of battery racks, and each battery rack may be configured to accommodate a plurality of battery modules in a rack frame. In addition, each battery module may include several secondary batteries, and each secondary battery may be referred to as a battery cell. Accordingly, the energy storage system may include a very large number of battery cells, for example thousands to tens of thousands of battery cells.

In the case of such a battery system, it is very important to diagnose the state of each battery cell. However, as the number of battery cells included therein increases, it is not easy to diagnose the state of a specific battery cell and detect a battery cell with a defect. Moreover, there may be many different types of failures for battery cells. For example, various problems such as exterior damage, separator damage, metal foreign material formation, electrolyte leakage, and tab defect may occur in the battery cell. Among them, the tab defect may be a defective type that occurs when at least one positive electrode tab 11 or negative electrode tab 12, namely the electrode tab 10, provided inside the battery cell is disconnected or cause a contact error. If such a tap defect occurs, the performance of the corresponding battery cell may be deteriorated or a malfunction may occur, and thus the performance and reliability of the battery system may be deteriorated as a whole. In addition, if a problem such as a tap defect occurs in a specific battery cell, the battery cell may ignite and cause a fire in the entire battery system.

Therefore, it is very important to identify which battery cell has a problem among the large number of battery cells included in the battery system and what type of defect has occurred. In particular, when a defective cell occurs, it is very important to diagnose such a defective cell at an early stage. However, an effective method for diagnosing such a defective battery cell and even diagnosing a specific defective type at an early stage has not yet been proposed.

DISCLOSURE

Technical Problem

The present disclosure is designed to solve the problems of the related art, and therefore the present disclosure is directed to providing a battery system diagnosing apparatus and method, which may effectively diagnose a defective battery cell among a plurality of battery cells included in a battery system at an early stage, and a battery system including the battery system diagnosing apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery system diagnosing apparatus, which diagnoses a battery system including a plurality of battery cells having electrode tabs therein, the apparatus comprising: a cell measuring unit configured to measure a voltage or current for each of the plurality of battery cells; and a processor configured to calculate a state of health (SOH) for each battery cell multiple times over a period of time by using the voltage or current measured by the cell measuring unit and detect a battery cell having a defect in the electrode tab among the plurality of battery cells based on the SOH of each battery cell calculated multiple times.

Here, the processor may be configured to compare the calculated SOH with a threshold value so that a disconnection defect and an incomplete contact defect are separately detected as a defect of a respective one of the electrode tabs.

In addition, when the case where the calculated SOH is equal to or less than the threshold value continues over a first criterion number of times, the processor may be configured to detect that the corresponding battery cell has the disconnection defect.

In addition, when the number of up/down switching of the calculated SOH with respect to the threshold value continues over a second criterion number of times, the processor may be configured to detect that the corresponding battery cell has the incomplete contact defect.

In addition, the processor may be configured to identify whether the number of up/down switching is increased or decreased.

In addition, the threshold value may be set based on a SOH of at least some battery cells among the plurality of battery cells.

In addition, the processor may be configured to detect whether each battery cell is defective by distinguishing a charging process and a discharging process for each battery cell.

In addition, the processor may be configured to set a precondition for calculating the SOH for each battery cell so that a precondition for the charging process and a precondition for the discharging process are set differently from each other.

In another aspect of the present disclosure, there is also provided a battery system, which comprises the battery system diagnosing apparatus according to the present disclosure.

In still another aspect of the present disclosure, there is also provided a battery system diagnosing method, which diagnoses a battery system including a plurality of battery cells having electrode tabs therein, the method comprising: measuring a voltage or current for each of the plurality of battery cells; calculating a state of health (SOH) for each battery cell multiple times over time by using the voltage or current measured in the measuring step; and detecting a battery cell having a defect in the electrode tab among the plurality of battery cells based on the SOH of each battery cell calculated multiple times in the calculating step.

Advantageous Effects

According to the present disclosure, in a battery system including a plurality of battery cells, it is possible to effectively diagnose a defective battery cell.

In particular, according to an embodiment of the present disclosure, it is possible to quickly detect a battery cell having a problem in the electrode tab among internal components.

Moreover, according to an embodiment of the present disclosure, it is possible to specifically classify the kind of problem that has occurred in the electrode tab.

Therefore, according to an embodiment of the present disclosure, appropriate follow-up measures such as separation, repair, replacement, or the like may be performed for a defective battery cell, particularly a battery cell having an abnormality in the electrode tab.

In addition, according to an embodiment of the present disclosure, since it is possible to obtain specific information on the defective type of the battery cell, so the battery cell manufacturing process may be appropriately modified based on the obtained information. Therefore, in this case, the defect rate of battery cells may be lowered.

In addition, the present disclosure may have various other effects, and these effects may be described in more detail below. In addition, with respect to each component, if any effect can be easily understood by those skilled in the art, such an effect will not be described in detail.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 3:
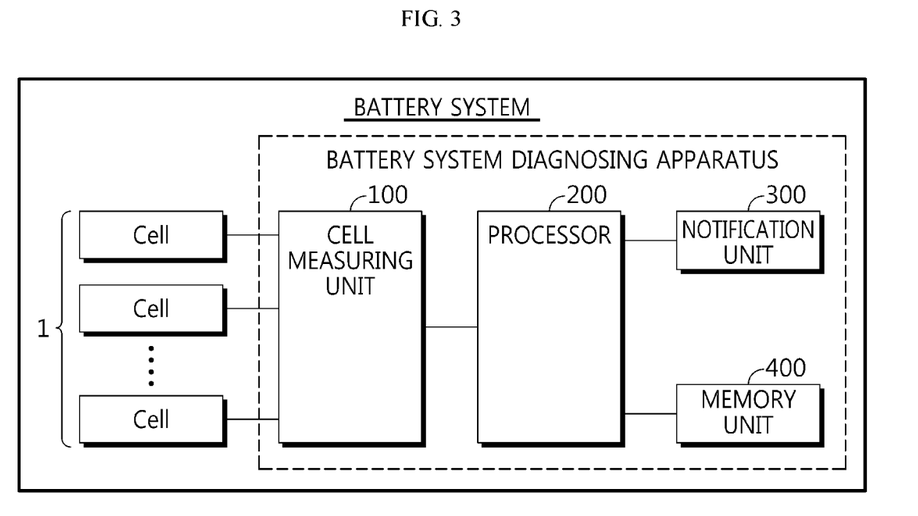
FIG. 3 is a block diagram schematically showing a functional configuration of a battery system diagnosing apparatus according to an embodiment of the present disclosure.

FIG. 3 is a block diagram schematically showing a functional configuration of a battery system diagnosing apparatus according to an embodiment of the present disclosure.

As shown in FIG. 3, the battery system may include a plurality of battery cells 1. Here, the battery cell 1 may mean one secondary battery. The secondary battery may be a pouch-type secondary battery in which an electrode assembly 20 is accommodated in a pouch exterior 30 as shown in FIGS. 1 and 2, and the secondary battery may also be a can-type secondary battery in which the electrode assembly is accommodated in a cylindrical or prismatic metal can. The battery cell 1 that is a target to be diagnosed by the battery system diagnosing apparatus of the present disclosure may be selected from various secondary batteries known at the filing date of this application.

In particular, the battery cell 1 may include an electrode tab 10 therein. For example, referring to FIG. 1, the electrode assembly 20 of the battery cell 1 may include at least one positive electrode plate and at least one negative electrode plate. In addition, a positive electrode tab 11 and a negative electrode tab 12 may be provided to the positive electrode plate and the negative electrode plate, respectively. Also, the positive electrode tab 11 may be connected to a positive electrode lead 41, and the negative electrode tab 12 may be connected to a negative electrode lead 42. This is widely known in the filing date of this application, and thus the internal configuration of the battery cell 1 will not be described in detail here.

The battery system may include a plurality of such secondary batteries (battery cells 1). That is, the battery system is a system including a plurality of battery cells 1, and may refer to a system configured to charge and discharge an electric power. The battery system may include various types of systems such as a battery module, a battery pack, a battery rack, and an energy storage system (ESS). In particular, in the battery system, the plurality of secondary batteries may be electrically connected to each other in series and/or in parallel.

The battery system diagnosing apparatus according to the present disclosure can be regarded as an apparatus for diagnosing the battery system including the plurality of battery cells 1 having electrode tabs therein as described above.

In particular, the battery system diagnosing apparatus according to the present disclosure may include a cell measuring unit 100 and a processor 200.

The cell measuring unit 100 may be configured to measure a voltage or current for each of the plurality of battery cells 1 included in the battery system. For example, the cell measuring unit 100 may include a voltage sensor, and may be configured to measure the voltage at both ends of each battery cell 1 included in the battery system. Alternatively, the cell measuring unit 100 may include a current sensor, and may be configured to measure a current flowing in each battery cell 1. Here, the cell measuring unit 100 may measure only one of a voltage or a current of each battery cell 1, or may be configured to measure both a voltage and a current of each battery cell 1.

In addition, for each battery cell 1, the cell measuring unit 100 may be configured to measure battery characteristics other than the voltage or current, such as temperature, a charging time, a discharging time, or the number of charging/discharging cycles, or the like for the battery cell 1.

The cell measuring unit 100 may be configured to measure characteristics of all battery cells 1 included in the battery system, for example, voltages of all battery cells 1. However, the present disclosure is not necessarily limited to this configuration, and the cell measuring unit 100 may be configured to measure a voltage or current only for some battery cells 1 among the plurality of battery cells 1 included in the battery system.

The battery system diagnosing apparatus according to the present disclosure may employ various battery measuring devices known at the filing date of this application as the cell measuring unit 100 of the present disclosure. Therefore, the cell measuring unit 100 will not be described in detail here.

The processor 200 may be electrically connected to the cell measuring unit 100 and receive measured data from the cell measuring unit 100. In particular, since the cell measuring unit 100 may measure the voltage or current for each of the plurality of battery cells 1, the processor 200 may receive the information about the voltage or current measured in this way for each battery cell 1 from the cell measuring unit 100.

In addition, the processor 200 may calculate a SOH for each battery cell 1 by using the voltage measurement value or the current measurement value of each battery cell 1 transmitted as described above. Here, the SOH of each battery cell 1 means a state of health, and may be calculated from the voltage or current of the battery cell 1. The SOH calculation method is widely known in various forms at the filing date of this application, and thus will not be described in detail here. In addition, in the battery system diagnosing apparatus according to the present disclosure, the processor 200 may employ the SOH calculation method known at the filing date of this application in order to calculate the SOH.

The processor 200 may calculate the SOH multiple times for each battery cell 1. In particular, the processor 200 may be configured to calculate the SOH for each battery cell 1 multiple times over time. For example, the processor 200 may be configured to calculate the SOH daily, weekly, or monthly for each battery cell 1. Alternatively, the processor may be configured to calculate the SOH for each battery cell 1 whenever the number of cycles increases by a predetermined number of times. For example, the processor 200 may be configured to calculate the SOH whenever the number of cycles increases by 10 for each battery cell 1.

Accordingly, since the processor 200 obtains the SOH calculation result over time for each battery cell 1, the processor 200 may have a plurality of SOH calculation results for each battery cell 1. For example, the processor 200 may have SOH calculation results 50 times for a predetermined period for each battery cell 1.

In addition, the processor 200 may be configured to detect a battery cell 1 having a defect based on the SOH of each battery cell 1 calculated multiple times. That is, the processor 200 may be configured to obtain a plurality of SOH calculation results for each battery cell 1 and detect which battery cell 1 has a problem among the plurality of battery cells 1 included in the battery system by using the plurality of obtained SOH calculation results.

In particular, the processor 200 may be configured to detect a battery cell 1 having a defect in the electrode tab by using the SOH calculation result for each battery cell 1. For example, as shown in FIG. 3, when a plurality of battery cells 1 are included in the battery system, the processor 200 may diagnose which battery cell 1 has a defect in the electrode tab among the plurality of battery cells 1.

According to this configuration of the present disclosure, a defective battery cell may be diagnosed early by using the SOH of each battery cell 1. In particular, according to this configuration, it is possible to accurately detect a battery cell 1 having a defect in the electrode tab 10 at an early stage. Accordingly, it is possible to effectively prevent problems caused by the defect of electrode tab 10, for example deterioration of overall performance, failure, or fire of the battery system.

The processor 200 may optionally include central processing units (CPUs), application-specific integrated circuits (ASIC), chipsets, logic circuits, registers, communication modems, data processing devices, or the like, known in the art, to execute various control logics performed in the present disclosure, or may be expressed using these terms. In addition, when a control logic is implemented in software, the processor 200 may be implemented as a set of program modules. In this case, the program module may be stored in an internal memory or an external memory module 400 or the like and executed by the processor 200. The memory module 400 may be provided inside or outside the processor 200, and may be connected to the processor 200 through various well-known means.

In particular, if a control device that is referred to as a microcontroller unit (MCU) or a battery management system (BMS) is included in the battery system, the processor 200 may be implemented by components such as the MCU or the BMS provided.

Meanwhile, in this specification, terms such as 'to be' or 'configured to be' for an operation or function of the processor 200 may include the meaning of 'programmed to be'.

In addition, the battery system diagnosing apparatus according to the present disclosure may further include a notification unit 300 as shown in FIG. 3.

The notification unit 300 may be configured to transmit the detection result by the processor 200 to a user or the like. For example, the notification unit 300 may include a display monitor, a speaker, a warning lamp, and the like, and display the defective cell detection result to the user in various ways, such as visual and auditory methods. In particular, the notification unit 300 may be configured to transmit information on which battery cell 1 has a defect in the electrode tab among the plurality of battery cells 1 included in the battery system, for example identification information or location information of a defective battery cell, to the user. In addition, the notification unit 300 may be connected to various wired or wireless communication networks known at the filing date of this application, and may be connected to a mobile terminal of the user or an external server. In this case, the notification unit 300 may transmit the defective cell detection information to the portable terminal or the server through a communication network.

In addition, the battery system diagnosing apparatus according to the present disclosure may further include a memory unit 400 as shown in FIG. 3.

The memory unit 400 may store programs and data necessary for the cell measuring unit 100 or the processor 200 to perform its functions. That is, the memory unit 400 may store data or programs necessary for at least some components of the battery system diagnostic apparatus according to an embodiment of the present disclosure to perform operations and functions, or data generated in the process of performing the operations and functions. For example, the memory unit 400 may store a plurality of SOH calculation values measured for each battery cell 1 for each time.

The memory unit 400 may adopt any information storage means known in the art to be capable of writing, erasing, updating and reading data, without limitation. As an example, the information storage means may include a RAM, a flash memory, a ROM, an EEPROM, a register, and the like. Also, the memory unit 400 may store program codes in which processes executable by the cell measuring unit 100 and/or the processor 200 are defined.

The processor 200 may be configured to compare the SOH calculation value with a threshold value. Here, the threshold value is a value to be compared with the SOH calculation value, and may be a criterion value for determining whether the SOH calculation value of the corresponding battery cell 1 is normal. In particular, the threshold value may be regarded as an SOH value capable of discriminating whether an electrode tab defect occurs in the corresponding battery cell 1. The threshold value may be expressed as a specific value or may be expressed as a specific range.

The threshold value may be stored in advance in the processor 200 itself or in the memory unit 400 so as to be used by the processor 200.

In addition, a plurality of threshold values may be set according to the lapse of time. That is, the SOH for each battery cell 1 is calculated multiple times over time, and a threshold value corresponding to each SOH calculated in this way may be set. For example, when the SOH is calculated for each battery cell 1 monthly such as January, February, March, . . . , the threshold value may also be set monthly such as a January threshold value, a February threshold value, a March threshold value, and the like. In this case, the threshold values may be set differently from each other, but at least some threshold values may be set identically to each other.

The processor 200 may diagnose a defect in the electrode tab based on the comparison result between the SOH calculation value and the threshold value. In particular, the processor 200 may be configured to detect whether the defect of the electrode tab is a disconnection defect or an incomplete contact defect. Here, the disconnection defect may mean a state where one or more electrode tabs 10 included in the battery cell 1 is completely cut off at a specific part. For example, in the battery cell 1 including ten electrodes tabs 10, the disconnection defect may be a state where at least one electrode tab 10 is completely cut. The incomplete contact defect may mean a state where one or more electrode tabs 10 included in battery cell 1 is cut off at a specific part and then comes into contact repeatedly. For example, the incomplete contact defect may mean a state where there is a cut part in at least one electrode tab 10, but contact occurs intermittently at the cut part.

According to this configuration of the present disclosure, the electrode tab defect in the battery cell 1 is detected using the SOH calculation value, and even the type of the electrode tab defect may be specifically diagnosed separately. Therefore, in this case, more appropriate measures may be taken according to the type of the electrode tab defect.

In particular, since the incomplete contact defect is a state where the cut portion of electrode tab 10 is repeatedly attached and detached, it may be predicted that a physical external force is applied to the electrode tab 10 or the battery cell 1. Therefore, in this case, it is possible to take a more appropriate action with respect to the external force applied to the corresponding battery cell 1. For example, when there is a battery cell 1 having an incomplete contact defect, the corresponding situation may be transmitted to the user through the notification unit 300. At this time, the user may identify the cause of the external force, and take appropriate measures to remove the cause of the external force, such as stopping the battery system or improving the fixing force of the rack frame.

In this embodiment, the processor 200 may be configured to judge whether the case where the SOH calculation value is less than or equal to the threshold value continues over a first criterion number of times. In addition, when the case where the SOH calculation value is less than or equal to the threshold value continues over the first criterion number of times, the processor 200 may be configured to detect the corresponding battery cell 1 as having a disconnection defect. This will be described in more detail with reference to FIG. 4.

Figure 4:
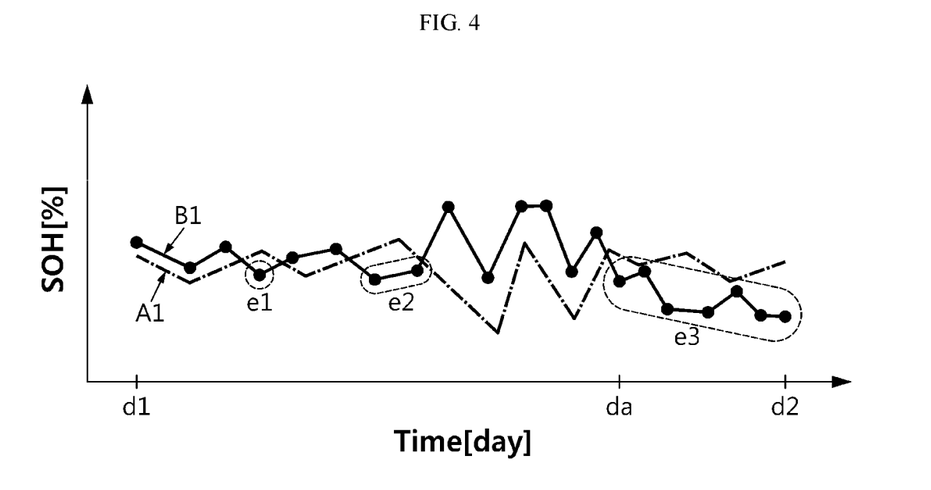
FIG. 4 is a graph showing a SOH calculated for any one battery cell by a processor according to an embodiment of the present disclosure together with a threshold value to be compared therewith.

FIG. 4 is a graph showing a SOH calculated for any one battery cell 1 by the processor 200 according to an embodiment of the present disclosure together with a threshold value to be compared therewith.

Referring to FIG. 4, a graph indicating the SOH calculated for a specific battery cell 1 during a predetermined period, namely between d1 and d2, is indicated by B1. In particular, in the graph B1, the SOH values calculated for the period between d1 and d2 are indicated by points, and such points are connected by a line.

In addition, in FIG. 4, the threshold value to be compared with the SOH calculation value B1 is indicated by A1. In particular, the threshold value A1 may be set to correspond to each of the SOH calculation values during a period of d1 to d2 so as to be compared with a plurality of SOH calculation values, as shown in FIG. 4. Moreover, the threshold value A1 may be configured to change during the period between d1 and d2, rather than remaining constant. That is, the threshold value corresponding to each calculation cycle of the SOH may be configured differently.

In this embodiment, the processor 200 may judge whether the calculated SOH B1 is equal to or less than the threshold value A1. In addition, if there is a part in which the SOH calculation value B1 is equal to or less than the threshold value A1, the processor 200 may judge whether the case where the SOH calculation value B1 is equal to or less than the threshold value A1 continues more than a first criterion number of times. Here, the first criterion number of times may be appropriately set according to various factors such as the specification of the battery cell 1 or the operating situation of the battery system. The first criterion number of times may be preset and stored in the memory unit 400 or the processor 200. As an example, the first criterion number of times may be set to 5 times. In this case, the processor 200 may judge whether the case where the SOH calculation value B1 is equal to or less than the threshold value A1 continues 5 or more times.

As a more specific example, referring to FIG. 4, while time elapses from d1 to d2, the processor 200 may identify a part where the SOH calculation value B1 is less than the threshold value A1. In this case, the processor 200 may extract an e1 part, an e2 part, and an e3 part as a continuous part among parts where the SOH calculation value B1 is less than the threshold value A1. In addition, the processor 200 may judge whether among the parts extracted as above, a part where the SOH calculation value B1 is less than the threshold value A1 continues over the first criterion number of times. For example, when the first criterion number of times is set to 5 times, the processor 200 may identify a part where the SOH calculation value B1 is less than the threshold value A1 continues 5 times or more.

In FIG. 4, in the e1 part, the part where the SOH calculation value B1 is less than the threshold value A1 continues only one time, and in the e2 part, the part where the SOH calculation value B1 is less than the threshold value A1 continues only two times. Therefore, in a state where the e1 part or the e2 part is identified, the processor 200 may not judge that an electrode tab defect occurs in the battery cell 1. However, in the e3 part, the part where the SOH calculation value B1 is less than the threshold value A1 continues 5 times or more. Accordingly, in a state where the e3 part is identified, the processor 200 may judge that an electrode tab defect occurs in the battery cell 1. In particular, the processor 200 may detect a disconnection defect with respect to the corresponding battery cell 1 from the first time point da when the e3 part starts. That is, if the state where the SOH calculation value B1 is less than the threshold value A1 continues for a predetermined time or longer, the processor 200 may judge that the electrode tab is disconnected for the corresponding battery cell 1. In addition, when the part where the SOH calculation value B1 is less than the threshold value A1 continues over the first criterion number of times, the processor 200 may judge that the capacity of the corresponding battery cell 1 is deteriorated. In addition, the processor 200 may transmit the capacity degradation judgment result to the user through the notification unit 300.

Meanwhile, in the embodiment of the FIG. 4, it is described that a disconnection defect or capacity degradation of the battery cell 1 detected based on the number of times that the SOH calculation value B1 is equal to or less than the threshold value A1, but it may also be configured that a disconnection defect of the battery cell 1 is detected based on the time when the SOH calculation value B1 is equal to or less than the threshold value A1. For example, if the case where the SOH calculation value B1 of a specific battery cell 1 is less than or equal to the threshold value A1 continues over a certain number of days (e.g. 4 days), the processor 200 may be configured to detect a disconnection defect for the corresponding battery cell 1.

Meanwhile, even if the number of times that the SOH calculation value B1 is equal to or less than the threshold value A1 is judged to be greater than or equal to the first criterion number of times, if a SOH B1 calculated within a predetermined time therefrom is judged to be greater than the threshold value A1, the processor 200 may cancel the judgment of a disconnection defect detected for the corresponding battery cell 1. For example, at a point after the e3 part based on the embodiment of FIG. 4, if the case where the SOH calculation value B1 is equal to or greater than the threshold value A1 continues over a predetermined number of times again, the processor 200 may cancel the judgment of a disconnection defect made at the time point of the e3 part. In this case, a disconnection defect may be judged more accurately.

Moreover, if a disconnection defect is judged by the processor 200, various additional information may be obtained depending on the defective judge time point. For example, in the case where a cell is judged as having a disconnection defect in the initial stage when the cell is mounted to the battery system, if the cell is in a BOL (Beginning of Life) state, namely if the cell is in a state immediately after manufacturing, it may be judged that there is a problem during the manufacturing process of the corresponding cell. Accordingly, in this case, information related to the manufacturing process of the corresponding cell may be transmitted, thereby helping to solve the problem in the manufacturing process of the corresponding cell. If the corresponding cell is a cell in a MOL (Middle of Life) state, namely if the cell is in a used state to some extent, information about the problem may be obtained by tracking an existing use history or the like. Alternatively, if the cell is judged as having a disconnection defect in a state of being used to some extent after being mounted to the battery system, problems of an operating system or operating conditions or problems at the manufacturing time point may be comprehensively reviewed additionally.

In addition, the processor 200 may be configured to judge whether the number of up/down switching of the SOH calculation value with respect to the threshold value continues over a second criterion number of times. In addition, the processor 200 may be configured to detect an incomplete contact defect with respect to the corresponding battery cell 1 when the number of up/down switching continues over the second criterion number of times. This will be described in more detail with reference to FIG. 5.

Figure 5:
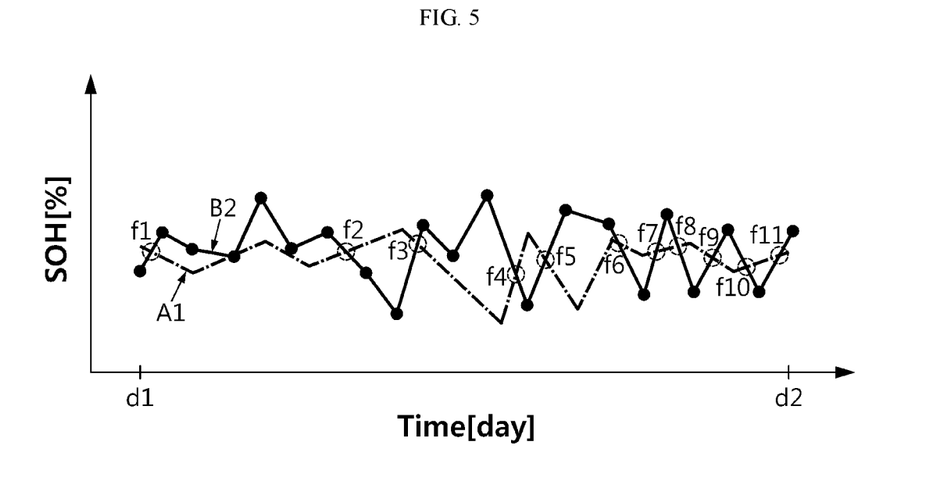
FIG. 5 is a graph showing a SOH calculated for another battery cell by the processor according to an embodiment of the present disclosure together with the threshold value to be compared therewith.

FIG. 5 is a graph showing a SOH calculated for another battery cell 1 by the processor 200 according to an embodiment of the present disclosure together with the threshold value to be compared therewith.

Referring to FIG. 5, a graph indicating a SOH calculated for another battery cell 1 different from the battery cell 1 of FIG. 4 during a period from d1 to d2 is illustrated as B2. Also, in the graph B2, the SOH value calculated at each time point is displayed as a point, and such points are connected by a line. In addition, the threshold value of FIG. 5 is shown in the same way as the threshold value of FIG. 4.

In this embodiment, when comparing the calculated SOH B2 with the threshold value A1, the processor 200 may identify a part that is greater than or equal to the threshold value A1 and is switched to be less than the threshold value A1. That is, the processor 200 may count the number of times or the time period when the SOH calculation value B2 rises after being less than the threshold value A1, or when the SOH calculation value B2 is lowered after being higher than the threshold value A1.

For example, the processor 200 may identify a switching point of the SOH calculation value B2 with respect to the threshold value A1 in the configuration of FIG. 5. In addition, the processor 200 may judge whether the number of consecutive switching points is equal to or greater than the second criterion number of times. Here, the second criterion number of times may be appropriately set according to various circumstances, such as the specification of the battery cell 1 or the operating situation of the battery system. In addition, the second criterion number of times may be preset and stored in the memory unit 400 or the processor 200. For example, the second criterion number of times may be set to 3 times. In this case, the processor 200 may judge that an incomplete contact defect exists in the electrode tab of the corresponding battery cell 1 when the number of switching times of the SOH calculation value B2 with respect to the threshold value A1 continues 3 times or more.

As a more specific example, referring to FIG. 5, while the time elapses from d1 to d2, the processor 200 may identify f1, f2, f3, . . . , f11 as time points at which the SOH calculation value B2 is switched in the vertical direction based on the threshold value A1. In particular, the vertical direction switching time point may be a point at which the graph of the SOH calculation value B2 and the graph of the threshold value A1 intersect each other. In addition, the processor 200 may judge whether each transition time point continues over the second criterion number of times, for example three times or more. Here, the continuation of the switching time point may be regarded as meaning that the switching part with respect to the threshold value continuously occurs between the operation time points, at three or more consecutive SOH calculation time points.

In the embodiment of FIG. 5, in the case of the time points f1, f2, and f3, it may be regarded that the number of switching times is not continuous, but the number of switching times is only one. In addition, in the case of f4 and f5, since two switching parts occur at three consecutive SOH calculation time points, it may be regarded that the number of consecutive switching corresponds to two. Since the number of consecutive switching is less than 3, which is the second criterion number of times, the processor 200 may not judge that the battery cell 1 has an incomplete contact defect at the time points f1 to f5.

However, the SOH threshold value is switched continuously from the time point f6 to the time point f11. That is, from the time point f6, the number of switching times of the SOH calculation value with respect to the threshold value is continued up to 6 times, and it may be regarded as continuing over the second criterion number of times (3 times). Therefore, in this case, the processor 200 may judge that an incomplete contact defect occurs in the electrode tab of the battery cell 1. The incomplete contact defect may be regarded as a situation in which one electrode tab is attached to another electrode tab or electrode lead and then detached therefrom repeatedly inside the battery cell 1. If the SOH calculation value B2 continuously vibrates up and down based on the threshold value A1 as above, the processor 200 may judge that an incomplete contact defect occurs in the electrode tab of the corresponding battery cell 1. In addition, if the SOH calculation value B2 continuously vibrates up and down based on the threshold value A1, the processor 200 may judge that the capacity of the corresponding battery cell 1 is unstable. In addition, the processor 200 may transmit this information to the user through the notification unit 300.

According to this embodiment, it is possible to effectively identify whether an incomplete contact defect exists in the electrode tab of the battery cell 1 by comparing the SOH calculation value B2 with the threshold value A1.

Meanwhile, in the embodiment of FIG. 5, the configuration for identifying whether an incomplete contact defect exists in the electrode tab of the battery cell 1 by comparing the SOH calculation value B2 of each battery cell 1 with the threshold value A1 is described, but the incomplete contact defect of the electrode tab may also be identified only by the SOH calculation value. This will be described in more detail with reference to FIG. 6.

Figure 6:
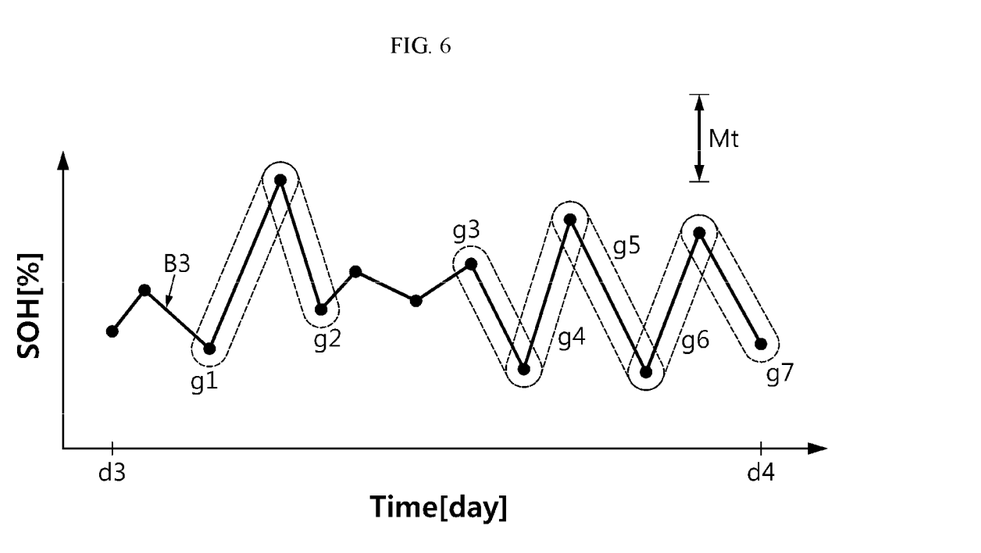
FIG. 6 is a graph showing a SOH calculated for still another battery cell by the processor according to an embodiment of the present disclosure.

FIG. 6 is a graph showing a SOH calculated for still another battery cell 1 by the processor 200 according to an embodiment of the present disclosure.

Referring to FIG. 6, a graph indicating the SOH calculated for any one battery cell 1 during the period from d3 to d4 is illustrated as B3. Here, also, the SOH value calculated at each time point is indicated by a point, and such points are connected by a line. However, unlike in FIGS. 4 and 5, the threshold value is not shown in FIG. 6.

The processor 200 may calculate a SOH change amount between each number of calculations with respect to the SOH calculation result graph. Here, the SOH change amount may mean a difference between successive SOH calculation values. In addition, the processor 200 may be configured to compare the calculated SOH change amount with a criterion change amount as indicated by Mt in FIG. 6. Next, if the case where the SOH change amount is greater than the criterion change amount Mt continues over a predetermined number of times, for example a third criterion number of times, the processor 200 may be configured to detect that the corresponding battery cell 1 has an incomplete contact defect.

More specifically, in the configuration of FIG. 6, parts where the SOH change amount is greater than the criterion change amount Mt are indicated by g1 to g7. Among them, in the g1 and g2 parts, the number of consecutive times is 2 times. In addition, in the g3 to g7 parts, the number of consecutive times is 5 times. If the third criterion number of times is 3 times, the processor 200 may judge that an incomplete contact defect occurs in the electrode tab of the corresponding battery cell 1 at the g3 to g7 time points at which the case where the SOH change amount is greater than the criterion change amount Mt exists three times or more consecutively.

In the above embodiment, the processor 200 may be configured to consider an immediately previous pattern as the number of times where the SOH change amount is greater than the criterion change amount Mt. More specifically, the processor 200 may not count that the SOH change amount is greater than the criterion change amount Mt, if the SOH change amount increases or decreases in the same pattern as the previous pattern, even if the SOH change amount is greater than the criterion change amount Mt. That is, the processor 200 may count that the SOH change amount is greater than the criterion change amount Mt only when the SOH change amount increases or decreases in a pattern different from the previous pattern. For example, if the SOH change amount increases in the calculation result of the previous number of times and the SOH change amount decreases in the calculation result of the current number of times, or if the SOH change amount decreases in the calculation result of the previous number of times and the SOH change amount increases in the calculation result of the current number of times, the processor 200 may be configured to judge whether the SOH change amount is greater than the criterion change amount Mt. In this case, in the form where the SOH calculation value vibrates up and down, the processor 200 may count the number of times when the amplitude of vibration is equal to or greater than a certain level (a criterion change amount) and defect an incomplete contact defect of the corresponding battery cell 1 based on the counting result.

According to this configuration of the present disclosure, even if a threshold value to be compared with the SOH is not set, an electrode tab defect of the battery cell 1, in particular whether an incomplete contact defect exists, may be detected. Therefore, the process for storing or calculating the threshold value may not be necessary.

In addition, the processor 200 may be configured to identify whether the number of up/down switching of the SOH calculation value with respect to the threshold value increases or decreases. That is, the processor 200 may count the number of times when the SOH calculation value switches up to down or switches down to up based on the threshold value. In addition, the processor 200 may record the counting result for each time and identify whether the number of switching gradually increases or decreases over time.

In particular, if the number of switching gradually increases over time, the processor 200 may judge that there is a high risk of a problem occurring in the electrode tab. Moreover, if the number of switching increases over time, the processor 200 may judge that the electrode tab of the corresponding battery cell 1 is progressing from a normal state to an incomplete contact defect state or is progressing from an incomplete contact defect state to a disconnection defect state.

The threshold value may be set based on the SOH of at least some of the plurality of battery cells 1. Moreover, the processor 200 may set the threshold value based on the SOH value calculated for at least some battery cells 1 among all the battery cells 1 included in the battery system, particularly all of the battery cells 1. This will be described in more detail with reference to FIG. 7.

Figure 7:
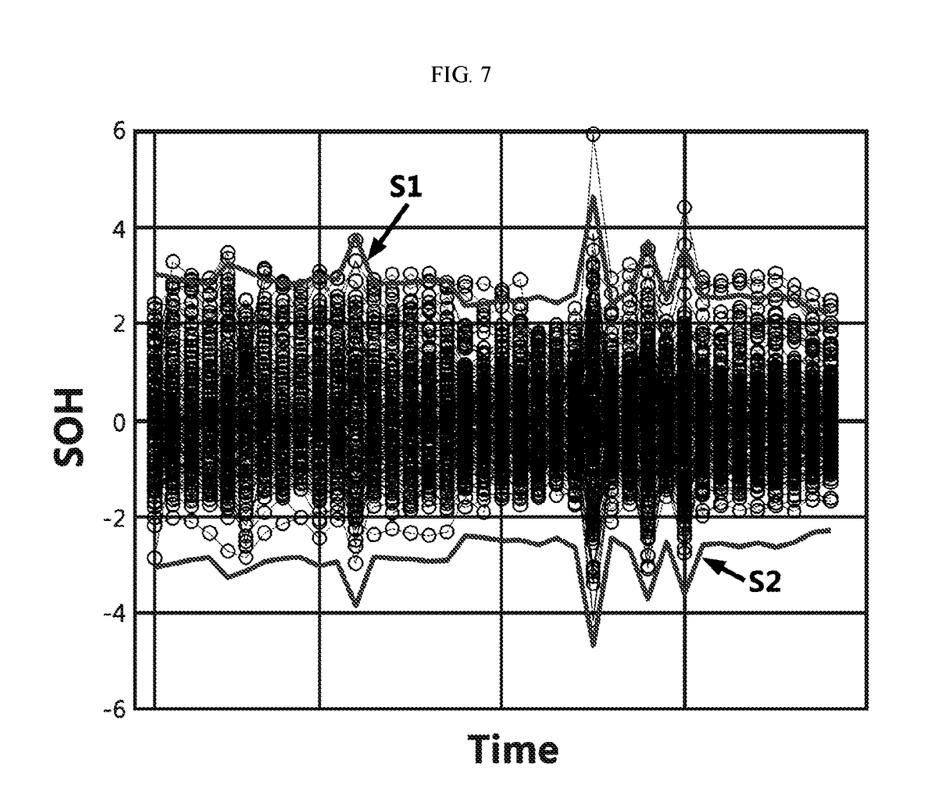
FIG. 7 is a graph showing SOH calculation values for several battery cells included in a battery system according to an embodiment of the present disclosure.

FIG. 7 is a graph showing SOH calculation values for several battery cells 1 included in the battery system according to an embodiment of the present disclosure.

Referring to FIG. 7, the SOH is calculated for each of the plurality of battery cells 1, and the SOH is calculated multiple times over time. In addition, the calculated SOH value for each battery cell 1 is displayed for each time. In FIG. 7, the x-axis represents time based on day, and the y-axis represents the SOH calculation value in the form of standard deviation. Moreover, in the y-axis, in a state where the average value of all SOH calculation values is at the center, the deviation based on the center is shown as sigma. In particular, in FIGS. 7, S1 and 52 represent limits corresponding to 3 sigma. As a standard deviation of the average value, the processor 200 may set a value corresponding to 3 sigma as a threshold value for each time (the number of calculation). In addition, the processor 200 may detect an electrode tab defect of each battery cell 1 by comparing the value corresponding to 3 sigma, namely the threshold value, with the SOH calculation value of each battery cell 1. In particular, the processor 200 may set a lower limit value of two values corresponding to 3 sigma located at both sides of the average value, namely a threshold value S1 corresponding to +3 sigma and a threshold value S2 corresponding to −3 sigma S2, as a threshold value.

According to this configuration of the present disclosure, it is possible to effectively diagnose a problem in a specific battery cell 1, particularly whether there is a defect in the electrode tab, in consideration of the overall situation of the battery system. Moreover, the SOH of the battery cell 1 included in the battery system may vary depending on various factors such as the operating state of the battery system or the surrounding environment. According to this embodiment, since the threshold value is appropriately set based on these factors, an electrode tab defect problem of a specific battery cell 1 may be more accurately diagnosed. In addition, according to this embodiment, it is not necessary to store the threshold value in advance in the memory unit 400, the processor 200, or the like.

Meanwhile, in FIG. 7, the value corresponding to 3 sigma is exemplified as a threshold value, but this is only an example, and the threshold value may be set as another value such as 6 sigma. That is, the processor 200 may be configured to compare a value corresponding to 6 sigma with respect to the average value of all battery cells 1, as a threshold value, with the SOH of each battery cell 1. Alternatively, the processor 200 may diagnose whether the SOH of each battery cell 1 is abnormal, based on the change in the cell-to-cell rank for the SOH value of each battery cell 1, or based on the difference between the SOH value of each battery cell 1 and the average SOH value of the entire battery system. In addition, the processor 200 may evaluate the SOH calculation value of each battery cell 1 in various other forms, and may judge whether the electrode tab of the corresponding battery cell 1 has a defect.

When calculating the SOH for each of the plurality of battery cells 1, the processor 200 may be configured such that the criterion time point for the SOH calculation between the battery cells 1 may be the same or have only a temporal error within a predetermined level. Here, since the SOH calculation is based on the result measured by the cell measuring unit 100, the cell measuring unit 100 may be configured such that the voltage measurement time point or the current measurement time point for each of the plurality of battery cells 1 is made at the same or similar time period. For example, when a plurality of battery cells 1 are included in the battery system, the cell measuring unit 100 may be configured to measure the voltage or current of all battery cells 1 at the same time, or within a temporal error range less than 1 second, at each measurement cycle.

According to this configuration of the present disclosure, the reliability of threshold value setting is secured by allowing the criterion time points for SOH calculation for the battery cells 1 to be the same or within a certain level, and also the accuracy in diagnosis by comparison between the threshold value and the calculation value may be improved.

Also, the processor 200 may be configured to separately perform a charging process and a discharging process for each battery cell 1, when detecting a defective battery cell.

For example, the processor 200 may be configured to separately identify a SOH pattern calculated based on the voltage measured in the charging process and a SOH pattern calculated based on the voltage measured in the discharging process. In this case, the threshold value may also be set separately for the charge threshold value and the discharge threshold value. For example, a threshold value in the form of 3 sigma as shown in FIG. 7 may be set separately to correspond to the state of charge and the state of discharge, respectively.

In addition, the processor 200 may be configured such that, for each battery cell 1, the SOH calculation value in the discharging process is compared with the discharge threshold value, and the SOH calculation value in the charging process is compared with the charge threshold value.

According to this configuration of the present disclosure, since the charging process and the discharging process are separately compared, the state of the battery cell 1 may be diagnosed more accurately. In particular, the pattern of the SOH of the battery cell 1 may be formed differently depending on whether it is in the state of charge or in the state of discharge, and according to this embodiment, the SOH may be diagnosed by reflecting this situation more appropriately. Therefore, the accuracy for diagnosing the electrode tab defect of the battery cell 1 may be further improved.

In particular, the processor 200 may set a precondition for calculating the SOH for battery cell 1. That is, the processor 200 may be configured to calculate the SOH only when a predetermined precondition is satisfied. In addition, the processor 200 may be configured not to calculate the SOH when the precondition is not satisfied.

For example, the processor 200 may calculate the SOH using SOC. Here, the method of obtaining a SOC is widely known at the filing date of this application, and thus will not be described in detail here.

More specifically, the processor 200 may be configured to calculate the SOH through Equation 1 below.

$$SOH(t) = \sum_{i}^{f} I/(SOCf - SOCi) \quad \text{[Equation 1]}$$

Here, I means a current flowing in the battery cell 1, f means q charging/discharging end time, and i means a charging/discharging start time. In addition, SOCf means an SOC value at the end of charging/discharging, and SOCi means an SOC value at the start of charging/discharging.

Here, the processor 200 may use the SOC change amount in the charging/discharging process as a precondition for calculating the SOH. In particular, the processor 200 may be configured to calculate the SOH of the corresponding battery cell 1 only when the difference between the SOC value at the start of charging and discharging of each battery cell 1 and the SOC value at the end of charging and discharging is equal to or greater than a certain level.

For example, in Equation 1, regarding the absolute value of the difference between the SOC value at the start of charging and discharging and the SOC value at the end of charging and discharging, the processor 200 may be configured to calculate the SOH only when |(SOCf−SOCi)|≥50. In this case, it may be regarded that the SOH is calculated only when the charging or discharging process is 50% or more.

According to this configuration of the present disclosure, it is possible to calculate the SOH only when charging or discharging is performed sufficiently over a certain level. In this case, the accuracy and reliability of the SOH calculation may be further improved.

Also, the processor 200 may use the time difference between the start time and the end time in the charging/discharging process as a precondition for calculating the SOH. In particular, the processor 200 may be configured to calculate the SOH of the corresponding battery cell 1 only when the time difference between the charging/discharging end time and the charging/discharging start time of each battery cell 1 is equal to or greater than a certain level.

For example, in Equation 1, the processor 200 may be configured to calculate the SOH only when (f−i)≥3600 s. In this case, the SOH may be calculated only when the charging or discharging process continues for 3600 seconds or more.

According to this configuration of the present disclosure, since the SOH is calculated only when charging or discharging continues for a predetermined time or more, the accuracy and reliability of the SOH calculation may be further improved.

Moreover, the processor 200 may be configured to calculate the SOH when both of the two preconditions described above, namely the precondition for the difference between SOCs and the precondition for the time difference, are satisfied.

In the above embodiment, the processor 200 may be configured to set the precondition for the charging process and the precondition for the discharging process differently.

For example, as a precondition during the charging process, the processor 200 may be configured to calculate the SOH when the SOC is less than or equal to a certain level at the start of charging. That is, the processor 200 may be configured not to calculate the SOH when the SOC at the start of charging exceeds a predetermined level.

As a more specific example, the processor 200 may be configured to calculate the SOH when the battery cell 1 satisfies SOCi≤7 in Equation 1 during the charging process. Here, when SOCi, which is the SOC at the charging start time point, exceeds 7%, the processor 200 may not calculate the SOH. According to this embodiment, it is possible to prevent a problem that the accuracy of the SOH calculation in the charging process is deteriorated since charging is performed only in an excessively high SOC section. Meanwhile, in this embodiment, 7%, which is the upper limit of SOCi, may be variously set according to the specifications of the battery cell 1 or the operating method of the battery system.

As another example, as a precondition during the discharging process, the processor 200 may be configured to calculate the SOH when the SOC is greater than or equal to a certain level at the start of discharging. That is, the processor 200 may be configured not to calculate the SOH only when the SOC at the start of discharging is less than a certain level.

As a more specific example, during a discharging process, the processor 200 may be configured to calculate the SOH when SOCi≥50 in Equation 1. Here, the processor 200 may not calculate the SOH if SOCi, which is the SOC at the discharging start time point, is less than 50%. According to this embodiment, it is possible to prevent a problem that the accuracy of the SOH calculation in the discharging process is deteriorated since discharging is performed in an excessively low SOC section. Meanwhile, in this embodiment, 50%, which is the lower limit of SOCi, may be variously set according to the specifications of the battery cell 1 or the operating method of the battery system.

According to this configuration of the present disclosure, the SOH is calculated separately for the charging process and the discharging process, and in particular, the preconditions for calculating the SOH may be set differently for the charging process and the discharging process. In this case, depending on whether the battery cell 1 is in a charging process or a discharging process, the SOH may be calculated under the most suitable conditions. Therefore, the accuracy and reliability of the SOH calculation may be further improved.

Moreover, the upper limit condition for the charging start SOC or the lower limit value for the discharging start SOC may be set as a precondition for the SOH calculation together with other common conditions described above. For example, in the charging process, the processor 200 may be configured to calculate the SOH in the charging process only when both the condition that the absolute value of the SOC difference (|SOCf−SOCi|) is equal to or greater than a certain level and the condition that the charging time (f−i) is equal to or greater than a certain level are satisfied together with the condition of the upper limit of the charging start SOC (SOCi). In addition, in the discharging process, the processor 200 may be configured to calculate the SOH in the discharging process only when both the condition that the absolute value of the SOC difference (|SOCf−SOCi|) is equal to or greater than a certain level and the condition that the discharging time (f−i) is equal to or greater than a certain level are satisfied together with the condition of the lower limit of the discharging start SOC (SOCi).

According to this configuration of the present disclosure, in the charging or discharging process, by allowing the SOH to be calculated only in a situation where a more accurate SOH can be obtained, the accuracy of the SOH calculation may be further improved.

The battery system according to the present disclosure may include the battery system diagnosing apparatus according to the present disclosure. Here, the battery system may include various types of systems such as a battery module, a battery pack, a battery rack, a battery bank, and an energy storage system (ESS). That is, the battery system according to the present disclosure may be implemented in the form of a battery module having a plurality of battery cells 1 inside a module case, or may be implemented in the form of a battery pack having a plurality of battery modules. In addition, the battery system according to the present disclosure may be implemented in the form of a battery pack having a rack frame configured to stack a plurality of battery modules or battery packs and a plurality of battery modules or battery packs accommodated in the rack frame. Alternatively, the battery system according to the present disclosure may be implemented in the form of a battery bank including a plurality of battery racks. Alternatively, the battery system according to the present disclosure may be implemented in the form of an energy storage system including a plurality of battery banks.

Figure 8:
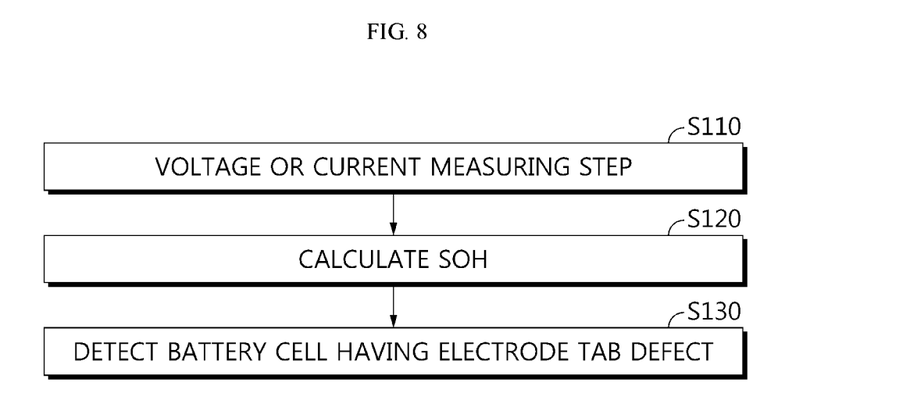
FIG. 8 is a flowchart for schematically illustrating a battery system diagnosing method according to an embodiment of the present disclosure.

FIG. 8 is a flowchart for schematically illustrating a battery system diagnosing method according to an embodiment of the present disclosure. In FIG. 8, each step may be performed by each component of the battery system diagnosing apparatus described above.

Referring to FIG. 8, the battery system diagnosing method according to the present disclosure is a method of diagnosing a battery system including a plurality of battery cells 1 having electrode tabs therein, and may include a measuring step (S110), a calculating step (S120) and a detecting step (S130).

Here, Step S110 may be a step of measuring a voltage or current for each of the plurality of battery cells 1 included in the battery system.

Next, Step S120 may be a step of calculating a SOH for each battery cell 1 multiple times over time by using the voltage or current measured in Step S110.

In addition, Step S130 may be a step of detecting a battery cell having a defect in the electrode tab among the plurality of battery cells 1 based on the SOH of each battery cell 1 calculated multiple times in Step S120.

For the details of the battery system diagnosing method according to the present disclosure, the features of the battery system diagnosing apparatus according to the present disclosure as described above may be applied in an identical or similar manner, and thus they will not be described in detail.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

1: battery cell
10: electrode tab
11: positive electrode tab, 12: negative electrode tab
20: electrode assembly
30: pouch exterior
31: upper pouch, 32: lower pouch
41: positive electrode lead, 42: negative electrode lead
100: cell measuring unit
200: processor
300: notification unit
400: memory unit

What is claimed is:

1. A battery system diagnosing apparatus, which diagnoses a battery system including a plurality of battery cells having electrode tabs therein, the battery system diagnosing apparatus comprising:

a cell measuring unit configured to measure a voltage or current for each of the plurality of battery cells; and a processor configured to calculate a state of health (SOH) for each battery cell multiple times over a period of time by using the voltage or current measured by the cell measuring unit and detect a battery cell having a defect in the electrode tab among the plurality of battery cells based on the SOH of each battery cell calculated multiple times, wherein the processor is further configured to compare the SOH of each battery cell with a threshold value to determine whether a defect occurs in the electrode tab among the plurality of battery cells.

2. The battery system diagnosing apparatus according to claim 1, wherein the processor is configured to compare the calculated SOH with the threshold value so that a disconnection defect and an incomplete contact defect are separately detected as a defect of a respective one of the electrode tabs.

3. The battery system diagnosing apparatus according to claim 2, wherein the threshold value is set based on a SOH of at least some battery cells among the plurality of battery cells.

4. The battery system diagnosing apparatus according to claim 2, wherein when the calculated SOH is equal to or less than the threshold value continues over a first criterion number of times, the processor is configured to detect that the corresponding battery cell has the disconnection defect.

5. The battery system diagnosing apparatus according to claim 2, wherein when a number of up/down switching of the calculated SOH with respect to the threshold value continues over a second criterion number of times, the processor is configured to detect that the corresponding battery cell has the incomplete contact defect.

6. The battery system diagnosing apparatus according to claim 5, wherein the processor is configured to identify whether the number of up/down switching is increased or decreased.

7. The battery system diagnosing apparatus according to claim 6, wherein the processor is configured to detect that the respective one of the electrode tabs is progressing from a normal state to an incomplete contact defect state or is progressing from the incomplete contact defect state to a disconnection defect state based on whether the number of up/down switching is increasing over time.

8. The battery system diagnosing apparatus according to claim 1, wherein the processor is configured to detect whether each battery cell is defective by distinguishing a charging process and a discharging process.

9. The battery system diagnosing apparatus according to claim 8, wherein the processor is configured to set a precondition for calculating the SOH for each battery cell so that a precondition for the charging process and a precondition for the discharging process are set differently from each other.

10. A battery system, comprising the battery system diagnosing apparatus according to claim 1.

11. The battery system diagnosing apparatus according to claim 1, wherein the threshold value changes over the period of time.

12. The battery system diagnosing apparatus according to claim 1, wherein when an amount change in the calculated SOH is greater than a criterion change amount continues over a predetermined number of times, the processor is configured to detect that the corresponding battery cell has the incomplete contact defect.

13. A battery system diagnosing method, which diagnoses a battery system including a plurality of battery cells having electrode tabs therein, the battery system diagnosing method comprising:

measuring a voltage or current for each of the plurality of battery cells;

calculating a state of health (SOH) for each battery cell multiple times over time by using the voltage or current measured in the measuring step; and detecting a battery cell having a defect in the electrode tab among the plurality of battery cells based on the SOH of each battery cell calculated multiple times in the calculating the SOH for each battery cell, wherein the detecting the battery cell having the defect is configured to detect the defect by comparing the SOH of each battery cell with a threshold value to determine whether the defect occurs in the electrode tab among the plurality of battery cells.

14. The battery system diagnosing apparatus according to claim 11, wherein the threshold value is calculated by taking an average SOH of the plurality of battery cells and adding or subtracting a preset value to the average SOH of the plurality of battery cells.

15. The battery system diagnosing apparatus according to claim 14, wherein the preset value is a value corresponding to a SOH of a battery cell that is at least three standard deviations away from the average SOH of the plurality of battery cells.

16. The battery system diagnosing method of claim 13, wherein the threshold value changes over a period of time.

17. The battery system diagnosing method according to claim 16, wherein the threshold value is calculated by taking an average SOH of the plurality of battery cells and adding or subtracting a preset value to the average SOH of the plurality of battery cells.

18. The battery system diagnosing method according to claim 17, wherein the preset value is a value corresponding to a SOH of a battery cell that is at least three standard deviations away from the average SOH of the plurality of battery cells.

19. The battery system diagnosing method according to claim 13, wherein when an amount change in the calculated SOH is greater than a criterion change amount continues over a predetermined number of times, detecting that a corresponding battery cell has an incomplete contact defect.

20. The battery system diagnosing method according to claim 13, further comprising detecting that a respective one of the electrode tabs is progressing from a normal state to an incomplete contact defect state or is progressing from the incomplete contact defect state to a disconnection defect state based on whether a number of up/down switching is increasing over time.

* * * * *